US012672470B2

(12) United States Patent　(10) Patent No.:　US 12,672,470 B2
Wang et al.　(45) Date of Patent:　Jun. 30, 2026

(54) DISPLAY PANEL INCLUDING LENS LAYER AND DISPLAY APPARATUS

(71) Applicants:CHENGDU BOE OPTOELECTRONICS TECHNOLOGY CO., LTD., Sichuan (CN); BOE TECHNOLOGY GROUP CO., LTD., Beijing (CN)

(72) Inventors: Yanqiang Wang, Beijing (CN); Huaisen Ren, Beijing (CN); Wei Xia, Beijing (CN); Yuanzheng Guo, Beijing (CN); Jie Li, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 925 days.

(21) Appl. No.: 17/919,823

(22) PCT Filed: Nov. 23, 2021

(86) PCT No.: PCT/CN2021/132546

§ 371 (c)(1),
(2) Date: Oct. 19, 2022

(87) PCT Pub. No.: WO2022/247180

PCT Pub. Date: Dec. 1, 2022

(65) Prior Publication Data

US 2024/0298508 A1　Sep. 5, 2024

(30) Foreign Application Priority Data

May 26, 2021　(CN) .......................... 202110576114.0

(51) Int. Cl.
H10K 59/80　(2023.01)

(52) U.S. Cl.
CPC ................................. *H10K 59/879* (2023.02)

(58) Field of Classification Search
CPC ... H10K 59/879; H10K 50/856; H10K 50/858
See application file for complete search history.

(56) References Cited

U.S. PATENT DOCUMENTS

2014/0175399 A1* 6/2014 Choi ..................... H10K 59/124
257/40
2014/0353618 A1 12/2014 Shim et al.
(Continued)

FOREIGN PATENT DOCUMENTS

CN 111524463 A 8/2020
CN 111613628 A 9/2020
(Continued)

OTHER PUBLICATIONS

First Office Action for Chinese Patent Application No. 202110576114.0 issued by the Chinese Patent Office on Apr. 29, 2022.
(Continued)

*Primary Examiner* — Nduka E Ojeh
(74) *Attorney, Agent, or Firm* — XSENSUS LLP

(57) ABSTRACT

A display panel includes a display substrate, a lens layer and a dimming layer. The display substrate includes a plurality of sub-pixels, and each sub-pixel has a light-emitting region. The lens layer is disposed on a side of a light-exiting surface of the display substrate and includes a plurality of lens pattern regions each opposite to a light-emitting region of a sub-pixel, and the light-emitting region of the sub-pixel at least partially overlaps with an orthogonal projection of the lens pattern region opposite thereto on the display substrate. Each lens pattern region is provided with a plurality of notches therein. The dimming layer is disposed on a side of the lens layer away from the display substrate, and at least a portion of the dimming layer is filled in the plurality of
(Continued)

C-C notches. A refractive index of the dimming layer is greater than a refractive index of the lens layer.

19 Claims, 7 Drawing Sheets

(56)                    References Cited

U.S. PATENT DOCUMENTS

| | | | |
|---|---|---|---|
| 2014/0353626 A1* | 12/2014 | Shim | H10K 50/86 |
| | | | 359/601 |
| 2015/0323707 A1 | 11/2015 | Shim et al. | |
| 2016/0133673 A1 | 5/2016 | Kim | |
| 2019/0165323 A1 | 5/2019 | Jo et al. | |
| 2021/0143235 A1* | 5/2021 | Byun | H10K 59/40 |
| 2021/0384473 A1 | 12/2021 | Zhang et al. | |
| 2023/0003927 A1 | 1/2023 | Jiao et al. | |

FOREIGN PATENT DOCUMENTS

| | | |
|---|---|---|
| CN | 111834544 A | 10/2020 |
| CN | 113314680 A | 8/2021 |

OTHER PUBLICATIONS

Second Office Action for Chinese Patent Application No. 202110576114.0 issued by the Chinese Patent Office on Nov. 16, 2022.

* cited by examiner

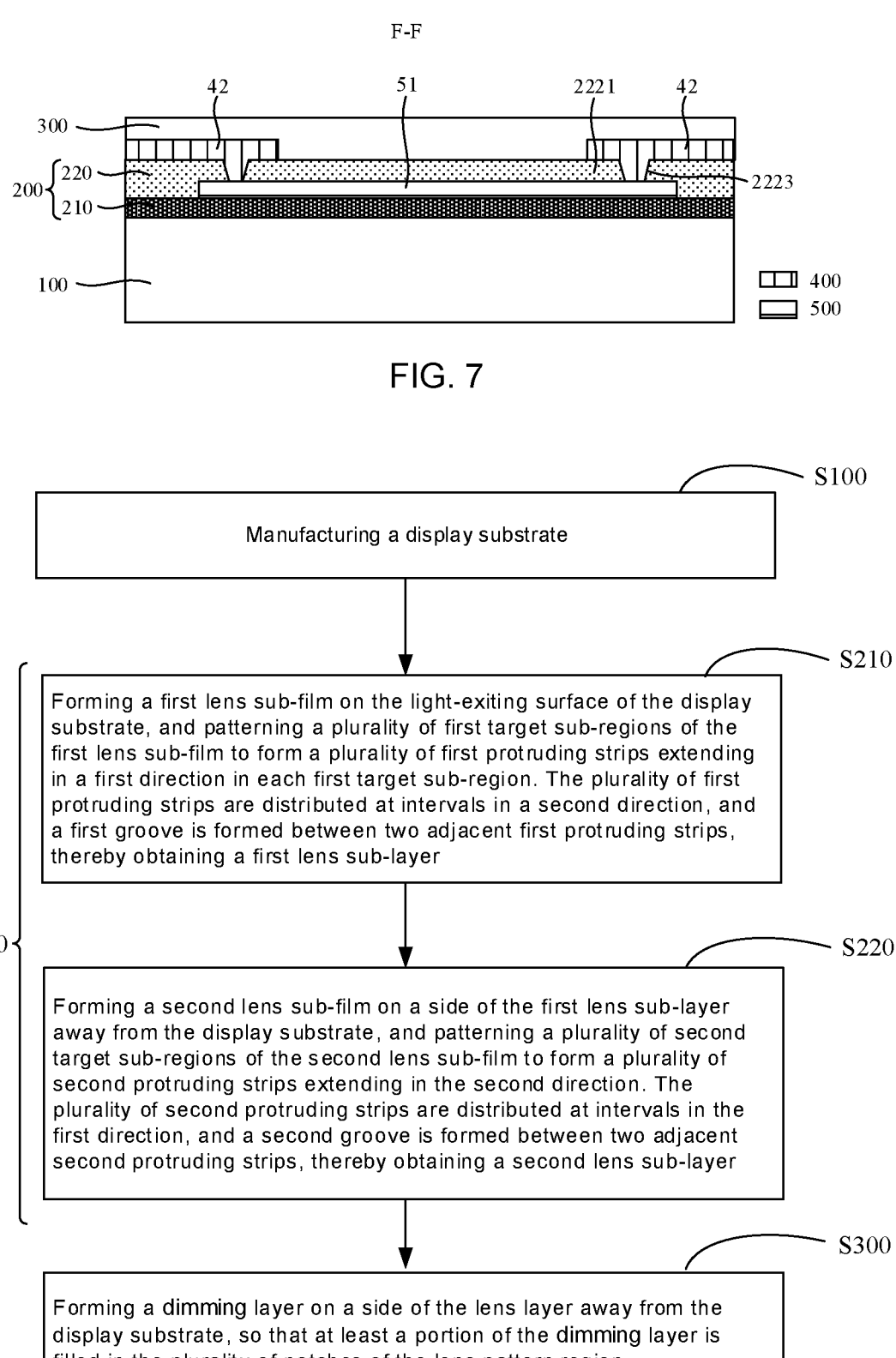

Manufacturing a display substrate

S210

Forming a first lens sub-film on the light-exiting surface of the display substrate, and patterning a plurality of first target sub-regions of the first lens sub-film to form a plurality of first protruding strips extending in a first direction in each first target sub-region. The plurality of first protruding strips are distributed at intervals in a second direction, and a first groove is formed between two adjacent first protruding strips, thereby obtaining a first lens sub-layer

S200

S220

Forming a second lens sub-film on a side of the first lens sub-layer away from the display substrate, and patterning a plurality of second target sub-regions of the second lens sub-film to form a plurality of second protruding strips extending in the second direction. The plurality of second protruding strips are distributed at intervals in the first direction, and a second groove is formed between two adjacent second protruding strips, thereby obtaining a second lens sub-layer

S300

Forming a dimming layer on a side of the lens layer away from the display substrate, so that at least a portion of the dimming layer is filled in the plurality of notches of the lens pattern region

FIG. 8

DISPLAY PANEL INCLUDING LENS LAYER AND DISPLAY APPARATUS

CROSS-REFERENCE TO RELATED APPLICATIONS

This application is a national phase entry under 35 USC 371 of International Patent Application No. PCT/CN2021/132546, filed on Nov. 23, 2021, which claims priority to Chinese Patent Application No. 202110576114.0, filed on May 26, 2021, which are incorporated herein by reference in their entirety.

TECHNICAL FIELD

The present disclosure relates to the field of display technologies, and in particular, to a display panel and a display apparatus.

BACKGROUND

Organic light-emitting diode (OLED) display panels have been widely used due to their characteristics of self-luminescence, wide viewing angle, high contrast, fast response speed, low power consumption, ultra lightness and ultra thinness, etc.

SUMMARY

In an aspect, a display panel is provided. The display panel includes a display substrate, a lens layer and a dimming layer. The display substrate includes a plurality of sub-pixels arranged in an array, and each sub-pixel has a light-emitting region. The lens layer is disposed on a side of a light-exiting surface of the display substrate and has a plurality of lens pattern regions. Each lens pattern region is opposite to a light-emitting region of a sub-pixel, and the light-emitting region of the sub-pixel at least partially overlaps with an orthogonal projection of the lens pattern region opposite thereto on the display substrate. Each lens pattern region is provided with a plurality of notches therein. The dimming layer is disposed on a side of the lens layer away from the display substrate, and at least a portion of the dimming layer is filled in the plurality of notches provided in the lens pattern region. A refractive index of the dimming layer is greater than a refractive index of the lens layer.

In some embodiments, the lens layer includes a first lens sub-layer. The first lens sub-layer has a plurality of first lens pattern sub-regions, each first lens pattern sub-region is opposite to the light-emitting region of the sub-pixel, and the light-emitting region of the sub-pixel at least partially overlaps with an orthogonal projection of the first lens pattern sub-region opposite thereto on the display substrate. Each first lens pattern sub-region is provided therein with a plurality of first protruding strips extending in a first direction and distributed at intervals in a second direction; and two adjacent first protruding strips are provided with a first groove therebetween extending in the first direction. The plurality of notches include first grooves. The first direction intersects the second direction.

In some embodiments, the first lens sub-layer further has a first connection pattern region. The first connection pattern region includes a plurality of first opening regions, and a border of each first opening region surrounds a first lens pattern sub-region. The first connection pattern region is provided with a first connection pattern therein, and a surface of the first connection pattern away from the display substrate is substantially flat.

In some embodiments, the lens layer further includes a second lens sub-layer. The second lens sub-layer is disposed between the first lens sub-layer and the dimming layer, and the second lens sub-layer has a plurality of second lens pattern sub-regions. Each second lens pattern sub-region is opposite to the light-emitting region of the sub-pixel, and the light-emitting region of the sub-pixel at least partially overlaps with an orthogonal projection of the second lens pattern sub-region opposite thereto on the display substrate. Each second lens pattern sub-region is provided therein with a plurality of second protruding strips extending in the second direction and distributed at intervals in the first direction; and two adjacent second protruding strips are provided with a second groove therebetween extending in the second direction. The plurality of notches further include second grooves.

In some embodiments, the second lens sub-layer further has a second connection pattern region. The second connection pattern region includes a plurality of second opening regions, and a border of each second opening region surrounds a second lens pattern sub-region. The second connection pattern region is provided with a second connection pattern therein, and a surface of the second connection pattern away from the display substrate is substantially flat. The second connection pattern and the plurality of second protruding strips provided in the second lens pattern sub-region are made of a same material and disposed in a same layer.

In some embodiments, in a cross-sectional profile of a first protruding strip parallel to the second direction and perpendicular to the display substrate, an end of the first protruding strip away from the display substrate is approximately arc-shaped; and/or in a cross-sectional profile of a second protruding strip parallel to the first direction and perpendicular to the display substrate, an end of the second protruding strip away from the display substrate is approximately arc-shaped.

In some embodiments, borders of orthogonal projections of the first lens pattern sub-region and the second lens pattern sub-region, that are opposite to the light-emitting region of the same sub-pixel, on the display substrate substantially coincide.

In some embodiments, the display panel further includes a touch electrode layer and a bridging layer. The touch electrode layer is disposed on the side of the light-exiting surface of the display substrate, and includes a plurality of first electrodes arranged in a first direction, a plurality of second electrodes arranged in a second direction, and a plurality of connecting portions. The bridging layer is disposed on a side of the touch electrode layer proximate to or away from the display substrate, and includes a plurality of bridging portions. Two adjacent first electrodes in the first direction are electrically connected through a connecting portion, and two adjacent second electrodes in the second direction are electrically connected through a bridging portion; alternatively, the two adjacent first electrodes in the first direction are electrically connected through another bridging portion, and the two adjacent second electrodes in the second direction are electrically connected through another connecting portion. At least one of the lens layer or the dimming layer is disposed between the touch electrode layer and the bridging layer.

In some embodiments, the lens layer includes a first lens sub-layer and a second lens sub-layer. One of the touch electrode layer and the bridging layer is disposed between the first lens sub-layer and the second lens sub-layer; and another of the touch electrode layer and the bridging layer is disposed between the second lens sub-layer and the dimming layer.

In some embodiments, the second lens sub-layer includes a second connection pattern, and the second connection pattern is provided therein with via holes each for connecting the bridging layer and the touch electrode layer.

In some embodiments, the lens layer includes a color filter layer and a black matrix. The color filter layer is disposed on the side of the light-exiting surface of the display substrate, and includes a plurality of filter portions. Each filter portion is opposite to the light-emitting region of the sub-pixel. The black matrix includes a plurality of openings, and at least a portion of each filter portion is located in an opening. The filter portion includes a base layer, and a plurality of first protruding strips disposed on a surface of the base layer away from the display substrate; the base layer and the plurality of first protruding strips are of a one-piece structure. Two adjacent first protruding strips are provided with a first groove therebetween.

In some embodiments, the lens layer includes a first lens sub-layer and a second lens sub-layer, and the first lens sub-layer and the second lens sub-layer are both organic film layers.

In some embodiments, the lens layer includes a first lens sub-layer and a second lens sub-layer, and the first lens sub-layer and the second lens sub-layer have substantially same refractive indexes for light.

In some embodiments, the lens layer includes a first lens sub-layer and a second lens sub-layer, and the first lens sub-layer and the second lens sub-layer each have a refractive index of 1.4 to 1.5, inclusive.

In some embodiments, the light-emitting region of the sub-pixel is located within a border of the orthogonal projection of the lens pattern region opposite thereto on the display substrate; a gap between a border of the light-emitting region of the sub-pixel and the border of the orthogonal projection of the lens pattern region opposite thereto on the display substrate is in a range of 1 μm to 5 μm, inclusive.

In some embodiments, the refractive index of the dimming layer is in a range of 1.6 to 1.8, inclusive.

In some embodiments, a surface of the dimming layer away from the display substrate is substantially flat.

In some embodiments, the dimming layer is an organic film layer.

In another aspect, a display apparatus is provided. The display apparatus includes the display panel as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings in some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

FIG. 5B is another sectional view taken along a line B-B in FIG. 1;

FIG. 6 is another partial enlarged view of region A in FIG. 1;

FIG. 7 is a structural diagram of a touch structure layer, in accordance with some embodiments;

FIG. 8 is a flow diagram of manufacturing a display panel, in accordance with some embodiments;

DETAILED DESCRIPTION

Figure 1:
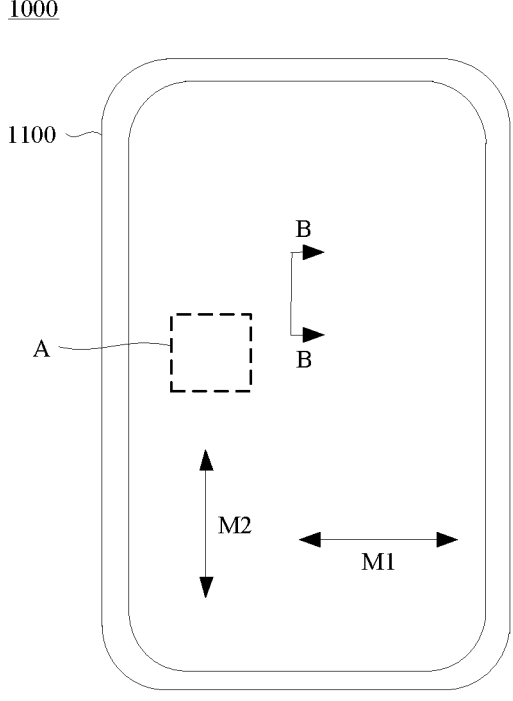
FIG. 1 is a schematic diagram of a display apparatus, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, the term "comprise" and other forms thereof such as the third-person singular form "comprises" and the present participle form "comprising" throughout the specification and the claims are construed as an open and inclusive meaning, i.e., "including, but not limited to". In the description of the specification, the term such as "some embodiments", "exemplary embodiments", or "example" is intended to indicate that specific features, structures, materials or characteristics related to the embodiment(s) or example(s) are included in at least one embodiment or example of the present disclosure. Schematic representations of the above terms do not necessarily refer to the same embodiment(s) or examples(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

The phrase "A and/or B" includes the following three combinations: only A, only B, and a combination of A and B.

As used herein, the term "about", "substantially" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in a device, and are not intended to limit the scope of the exemplary embodiments.

In this text, the expression "disposed in a same layer" is used, which means that a film layer for forming specific patterns is formed by using a same mask through a single patterning process. Depending on different specific patterns, the patterning process may include several exposure, development or etching processes, and the specific patterns in the formed layer structure may be continuous or discontinuous, and these specific patterns may also be at different heights or have different thicknesses.

Referring to FIG. 1, some embodiments of the present disclosure provide a display apparatus 1000, and the display apparatus 1000 may be a television, a computer, a notebook computer, a mobile phone, a tablet computer, a personal digital assistant (PDA), a vehicle-mounted computer, etc.

In some embodiments, the display apparatus 1000 may be an electroluminescent display apparatus or a photoluminescent display apparatus. In a case where the display apparatus 1000 is the electroluminescent display apparatus, the electroluminescent display apparatus may be an organic light-emitting diode (OLED) display apparatus or a quantum dot light-emitting diode (QLED) display apparatus. In a case where the display apparatus 1000 is the photoluminescent display apparatus, the photoluminescent display apparatus may be a quantum dot photoluminescent display apparatus.

Figure 2:
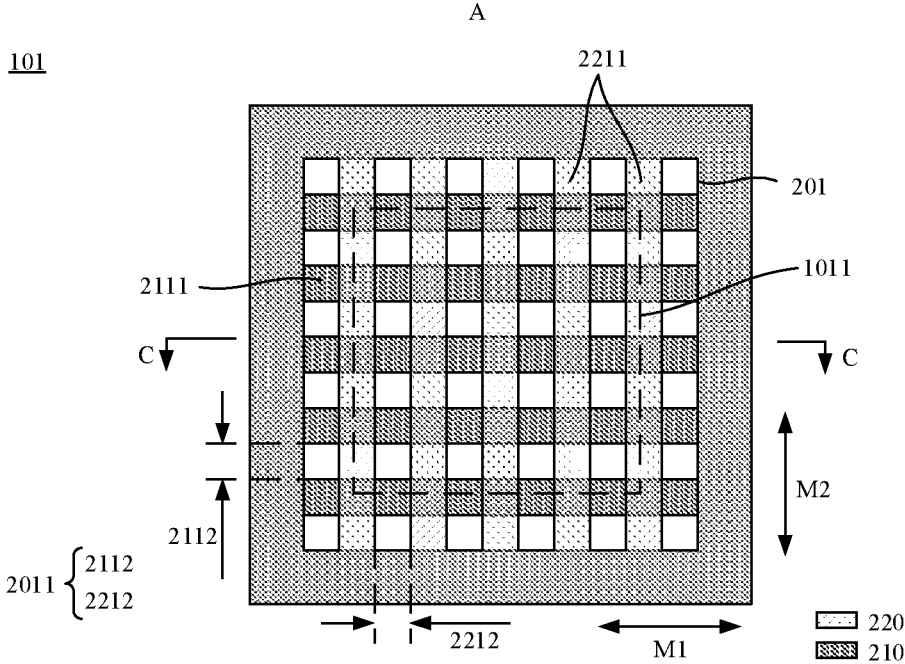
FIG. 2 is a partial enlarged view of region A in FIG. 1.
Figure 3A:
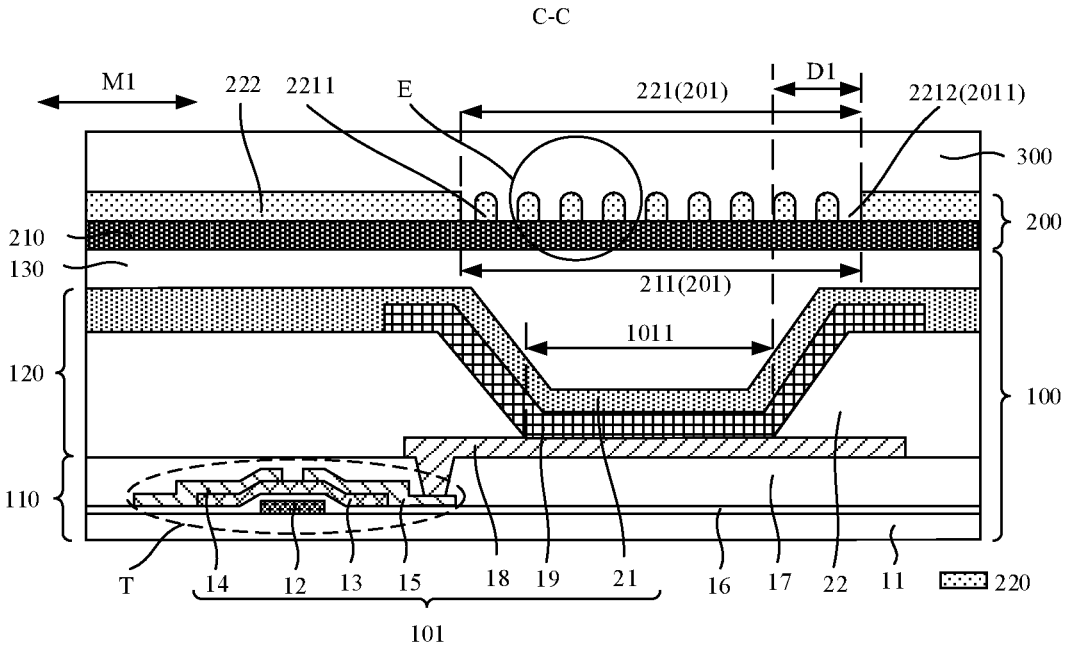
FIG. 3A is a sectional view taken along a line C-C in FIG. 2.

The display apparatus 1000 includes a display panel 1100. Referring to FIGS. 2 and 3A, the display panel 1100 includes a display substrate 100, the display substrate 100 includes a plurality of sub-pixels 101 arranged in an array, and the sub-pixels 101 play the role of displaying an image. FIG. 2 is a partial enlarged view of a single sub-pixel 101 in FIG. 1. FIG. 3A only exemplarily shows a single sub-pixel 101.

The display substrate 100 includes a backplane 110, a plurality of light-emitting devices 120 and an encapsulation layer 130 that are stacked.

Referring to FIG. 3A, the backplane 110 includes a substrate 11, and a pixel driving circuit in each sub-pixel 101. The pixel driving circuit includes a plurality of thin film transistors (TFTs) T. The thin film transistor T includes a gate 12, an active layer 13, a source 14 and a drain 15. The source 14 and the drain 15 are each in contact with the active layer 13. The backplane 110 further includes a gate insulating layer 16 disposed between the gate 12 and the active layer 13. FIG. 3A only exemplarily shows a structure of a driving thin film transistor T in the plurality of thin film transistors T.

The light-emitting device 120 includes an anode 18, a light-emitting functional layer 19 and a cathode layer 21. The anode 18 is electrically connected to a drain 15 of a thin film transistor T serving as the driving thin film transistor in the plurality of thin film transistors T.

The display substrate 100 further includes a pixel defining layer 22, the pixel defining layer 22 includes a plurality of opening regions, and at least a portion of the light-emitting functional layer 19 of the light-emitting device 120 is located in an opening region.

In some embodiments, the light-emitting functional layer 19 includes a light-emitting layer. In some other embodiments, in addition to the light-emitting layer, the light-emitting functional layer 19 further includes one or more of an electron transporting layer (ETL), an electron injection layer (EIL), a hole transporting layer (HTL) and a hole injection layer (HIL).

In some embodiments, the encapsulation layer 130 may be an encapsulation film or an encapsulation substrate.

The backplane 110 of the display substrate 100 further includes a planarization layer 17 disposed between the thin film transistor T and the anode 18.

For example, the display substrate 100 is a top-emission display substrate, light emitted by the light-emitting device 120 includes light exiting vertically (light exiting in a direction perpendicular to the substrate 11 and away from the substrate 11), and light scattered to the surroundings (light exiting in a direction having a certain included angle with the substrate 11 and away from the substrate 11; the included angle being less than) 90°.

Part of the light scattered to the surroundings cannot exit from a light-exiting surface of a display substrate 100, resulting in low light-exiting efficiency of the display substrate 100. Therefore, how to improve the light-exiting efficiency of a display panel 1100 is an important research direction of the display panel 1100.

Some embodiments of the present disclosure provide a display panel 1100. Referring to FIGS. 2 and 3A, the display panel 1100 includes a display substrate 100, a lens layer 200 and a dimming layer 300.

The display substrate 100 includes a plurality of sub-pixels 101 arranged in an array, and each sub-pixel 101 has a light-emitting region 1011. Under driving of the pixel driving circuit, a portion of the light-emitting device 120 located in the light-emitting region 1011 is capable of emitting light.

The lens layer 200 is disposed on a side of the light-exiting surface of the display substrate 100, and has a plurality of lens pattern regions 201. Each lens pattern region 201 is opposite to a light-emitting region 1011 of a sub-pixel 101, and the light-emitting region 1011 of the sub-pixel 101 at least partially overlaps with an orthogonal projection of the lens pattern region 201 opposite thereto on the display substrate 100, so that at least part of the light exiting from the light-emitting region 1011 of each sub-pixel 101 may be incident onto the lens pattern region 201 opposite to the light-emitting region 1011. Each lens pattern region 201 is provided with a plurality of notches 2011 therein.

It will be understood that "the orthogonal projection of the lens pattern region 201 on the display substrate 100" refers to a projection of the lens pattern region 201 formed on the display substrate 100 in a direction perpendicular to the light-exiting surface of the display substrate 100.

The dimming layer 300 is disposed on a side of the lens layer 200 away from the display substrate 100, and at least a portion of the dimming layer 300 is filled in the plurality of notches 2011 provided in the lens pattern region 201. A refractive index of the dimming layer 300 is greater than a refractive index of the lens layer 200. The dimming layer 300 is in direct contact with the lens layer 200. In the lens pattern region 201 of the lens layer 200, an interface having a certain included angle with the light-exiting surface of the display substrate 100 is formed between the dimming layer 300 and the lens layer 200. Part of the light exiting from the light-emitting region 1011 of the sub-pixel 101 and scattered to the surroundings can be incident onto the above interface, and be refracted or reflected at the interface.

Figure 4:
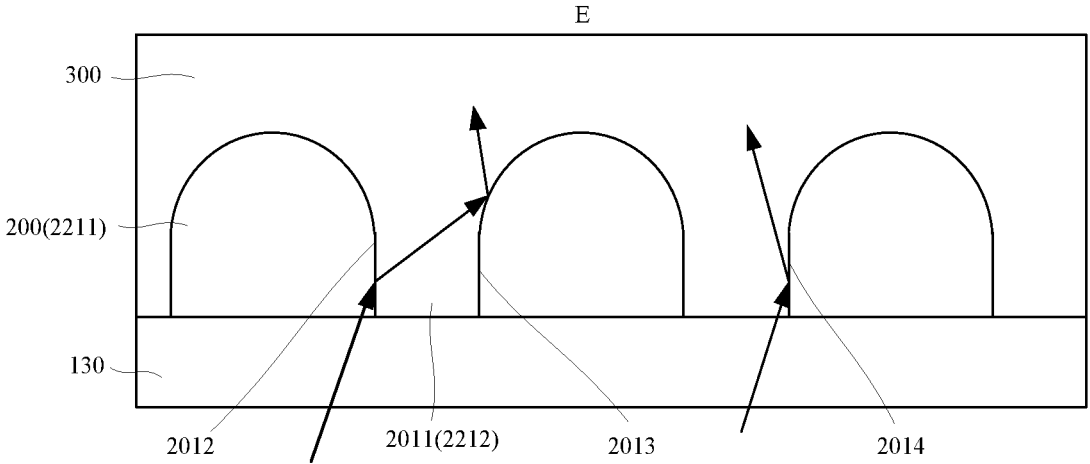
FIG. 4 is a partial enlarged view of region E in FIG. 3A.

Referring to FIGS. 3A and 4, part of the light exiting from the display substrate 100 and scattered to the surroundings enters the lens layer 200. The part of the light entering the lens layer 200 is refracted by a first side wall 2012 of the lens layer 200 proximate to the notch 2011 and enters the portion of the dimming layer 300 filled in the notch 2011, and then continues to be directed to a second side wall 2013 opposite to the first side wall 2012. Since the refractive index of the dimming layer 300 is greater than the refractive index of the lens layer 200, part of the light incident onto the second side wall 2013 may be reflected by the second side wall 2013. At least a part of the reflected light can exit from a front surface (the light-exiting surface) of the display panel 1100, thereby increasing the light-exiting amount of the display panel 1100, improving the light-exiting efficiency of the display panel 1100, and reducing the power consumption of the display panel 1100.

With continued reference to FIG. 4, another part of the light exiting from the display substrate 100 and scattered to the surroundings directly enters the portion of the dimming layer 300 filled in the notch 2011, and continues to be directed to a third side wall 2014, enclosing the notch 2011, of the lens layer 200. Part of the light incident onto the third side wall 2014 is reflected by the third side wall 2014, and at least a part of the reflected light can exit from the front surface of the display panel 1100, thereby increasing the light-exiting amount of the display panel 1100, improving the light-exiting efficiency of the display panel 1100, and reducing the power consumption of the display panel 1100.

The light-emitting region 1011 of the sub-pixel 101 at least partially overlaps with the orthogonal projection of the lens pattern region 201 opposite thereto on the display substrate 100, which may be a case where the light-emitting region 1011 of the sub-pixel 101 overlaps with the orthogonal projection of the lens pattern region 201 opposite thereto on the display substrate 100, or a case where the light-emitting region 1011 of the sub-pixel 101 partially overlaps with the orthogonal projection of the lens pattern region 201 opposite thereto on the display substrate 100. In a case where the light-emitting region 1011 of the sub-pixel 101 overlaps with the orthogonal projection of the lens pattern region 201 opposite thereto on the display substrate 100, a border of the light-emitting region 1011 of the sub-pixel 101 may be located within a border of the orthogonal projection of the lens pattern region 201 opposite thereto on the display substrate 100, alternatively, the border of the light-emitting region 1011 of the sub-pixel 101 may be located outside the border of the orthogonal projection of the lens pattern region 201 opposite thereto on the display substrate 100, alternatively, the border of the light-emitting region 1011 of the sub-pixel 101 may substantially overlap with the border of the orthogonal projection of the lens pattern region 201 opposite thereto on the display substrate 100.

In some embodiments, referring to FIG. 3A, the border of the light-emitting region 1011 of the sub-pixel 101 is located within the border of the orthogonal projection of the lens pattern region 201 opposite thereto on the display substrate 100, and a gap D1 between the border of the light-emitting region 1011 of the sub-pixel 101 and the border of the orthogonal projection of the lens pattern region 201 opposite thereto on the display substrate 100 is in a range of 1 μm to 5 μm, inclusive. As a result, the light exiting from the light-emitting region 1011 of the sub-pixel 101 is directed to the lens pattern region 201 of the lens layer 200 as much as possible, which is helpful for the lens layer 200 and the dimming layer 300 to reflecting the light exiting from the light-emitting region 1011 of the sub-pixel 101 and scattered to the surroundings to the front surface of the display panel 1100 to exit, so as to improve the light-exiting efficiency of the display panel 1100.

Figure 5A:
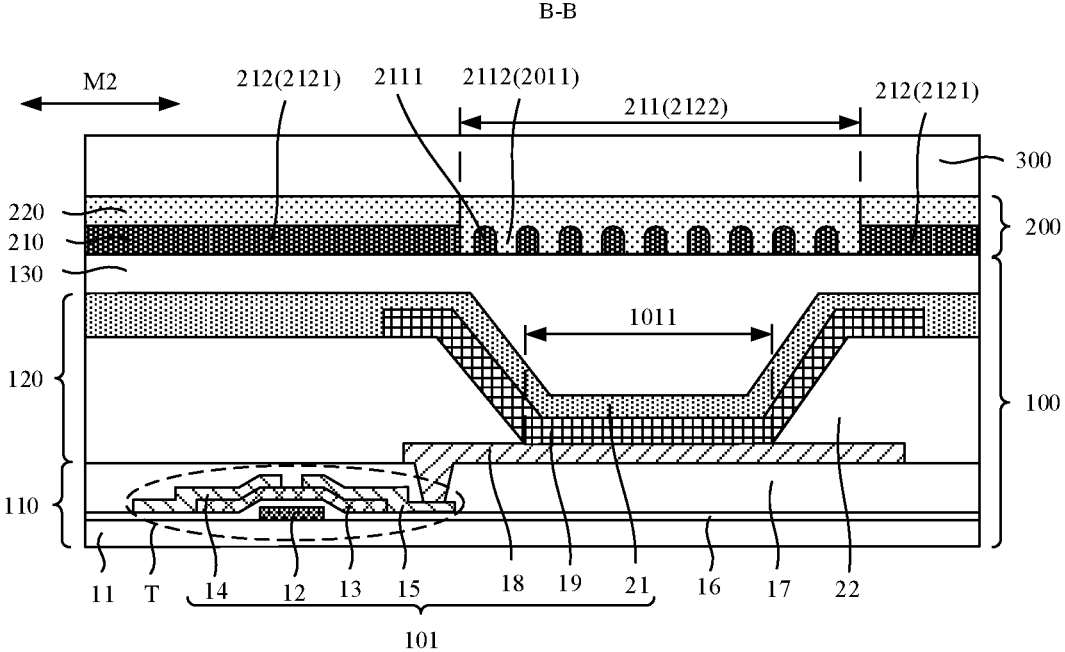
FIG. 5A is a sectional view taken along a line B-B in FIG. 1.

In some embodiments, referring to FIGS. 2 and 5A, the lens layer 200 includes a first lens sub-layer 210. The first lens sub-layer 210 has a plurality of first lens pattern sub-regions 211, each first lens pattern sub-region 211 is opposite to the light-emitting region 1011 of the sub-pixel 101, and the light-emitting region 1011 of the sub-pixel 101 at least partially overlaps with an orthogonal projection of the first lens pattern sub-region 211 opposite thereto on the display substrate 100, so that at least part of the light exiting from the light-emitting region 1011 of each sub-pixel 101 may enter the first lens pattern sub-region 211 opposite to the light-emitting region 1011. It will be understood that, the first lens pattern sub-region 211 is not shown in FIG. 2, and a border of the first lens pattern sub-region 211 substantially coincides with a border of the lens pattern region 201.

For example, the light-emitting region 1011 of the sub-pixel 101 overlaps with the orthogonal projection of the first lens pattern sub-region 211 opposite thereto on the display substrate 100, and the light-emitting region 1011 of the sub-pixel 101 is located within a border of the orthogonal projection of the first sub-lens pattern region 211 opposite thereto on the display substrate 100, so that the light exiting from the light-emitting region 1011 of the sub-pixel 101 is directed to the first lens pattern sub-region 211 as much as possible, which is helpful to reflect light exiting from the light-emitting region 1011 of the sub-pixel 101 and scattered to the surroundings to the front surface of the display panel 1100 to exit, thereby improving the light-exiting efficiency of the display panel 1100.

Referring to FIGS. 2 and 5A, the first lens pattern sub-region 211 is provided with a plurality of first protruding strips 2111 extending in a first direction M1, and the plurality of first protruding strips 2111 are distributed at intervals in a second direction M2. A first groove 2112 is provided between two adjacent first protruding strips 2111.

The cooperation of the first lens pattern sub-region 211 and the dimming layer 300 can reflect part of the light, exiting from the light-emitting region 1011 of the sub-pixel 101 and scattered in the second direction M2 toward a direction away from the first lens pattern sub-region 211, to the front surface of the display panel 1100 to exit, thereby improving the light-exiting efficiency of the display panel 1100.

The first direction M1 intersects the second direction M2. For example, the first direction M1 and the second direction M2 are perpendicular to each other.

In some embodiments, the first direction M1 may be one of a row direction and a column direction in which the plurality of sub-pixels 101 are arranged, and the second direction M2 may be the other of the row direction and the column direction in which the plurality of sub-pixels 101 are arranged. For example, the first direction M1 is the row direction in which the plurality of sub-pixels 101 are arranged, and the second direction M2 is the column direction in which the plurality of sub-pixels 101 are arranged.

Referring to FIGS. 2 and 5A, the first lens sub-layer 210 further includes a first connection pattern region 212. The first connection pattern region 212 includes a plurality of first opening regions 2122, and a border of each first opening region 2122 surrounds a first lens pattern sub-region 211. The plurality of first protruding strips 2111 provided in the first lens pattern sub-region 211 are located in the first opening region 2122 formed by the first connection pattern region 212. The first lens pattern sub-regions 211 are connected to each other through the first connection pattern region 212. The border of the first lens pattern sub-region 211 coincides with a border of the first opening region 2122 surrounding the first lens pattern sub-region 211.

The first connection pattern region 212 is provided with a first connection pattern 2121, and a surface of the first connection pattern 2121 away from the display substrate 100 is substantially flat. In this way, it is beneficial to provide other functional layer structures (e.g., a touch electrode layer 400 or a bridging layer 500) on the surface of the first connection pattern 2121 away from the display substrate 100. Moreover, there is no need to pattern the surface of the first connection pattern 2121 away from the display substrate 100, which can simplify the manufacturing process of the first connection pattern 2121 and reduce the manufacturing cost of the first connection pattern region 212.

For example, referring to FIG. 5A, in a case where the plurality of first protruding strips 2111 provided in the first lens pattern sub-region 211 and the first connection pattern 2121 are made of the same material, the plurality of first protruding strips 2111 and the first connection pattern 2121 are formed in the same layer.

Figure 3B:
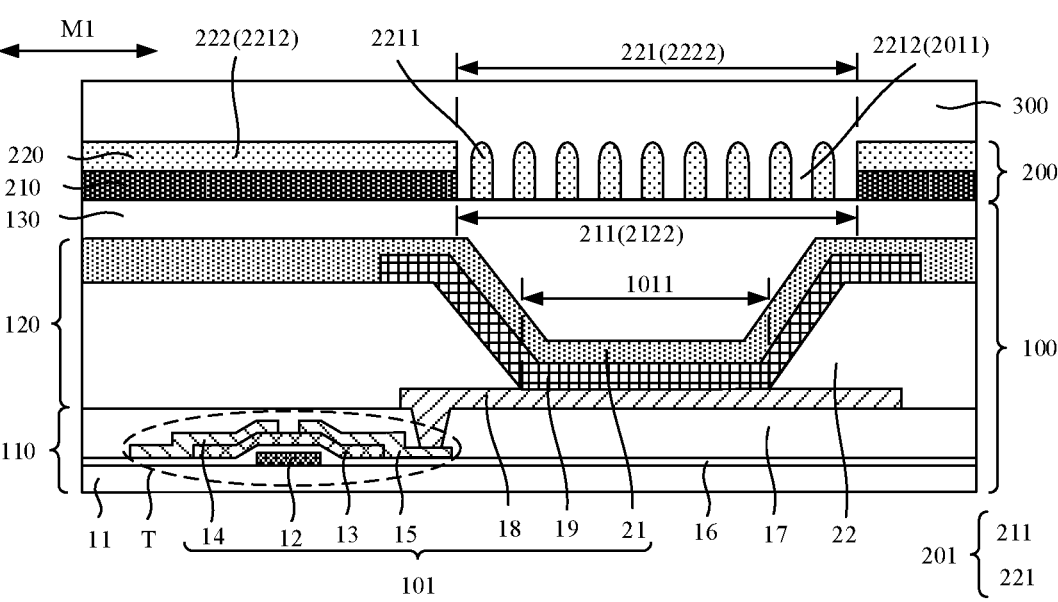
FIG. 3B is another sectional view taken along a line C-C in FIG. 2.

In some embodiments, referring to FIGS. 2, 3A and 3B, in addition to the first lens sub-layer 210, the lens layer 200 further includes a second lens sub-layer 220. FIG. 3A is a cross-sectional view in a case of the section line C-C in FIG. 2 passing through the first protruding strip 2111, and FIG. 3B is a cross-sectional view in a case of the section line C-C in FIG. 2 passing through the first groove 2112. The second lens sub-layer 220 is disposed between the first lens sub-layer 210 and the dimming layer 300. The second lens sub-layer 220 has a plurality of second lens pattern sub-regions 221. Each second lens pattern sub-region 221 is opposite to the light-emitting region 1011 of the sub-pixel 101, and the light-emitting region 1011 of the sub-pixel 101 at least partially overlaps with an orthogonal projection of the second lens pattern sub-region 221 opposite thereto on the display substrate 100, so that at least part of the light exiting from the light-emitting region 1011 of each sub-pixel 101 may enter the second lens pattern sub-region 221 of the second lens sub-layer 220. A border of the second lens pattern sub-region 221 substantially coincides with the border of the lens pattern region 201.

For example, the light-emitting region 1011 of the sub-pixel 101 overlaps with the orthogonal projection of the second lens pattern sub-region 221 opposite thereto on the display substrate 100, and the light-emitting region 1011 of the sub-pixel 101 is located within a border of the orthogonal projection of the second lens pattern sub-region 221 opposite thereto on the display substrate 100, so that the light exiting from the light-emitting region 1011 of the sub-pixel 101 is directed to the second lens pattern sub-region 221 as much as possible, which is helpful to reflect the light exiting from the light-emitting region 1011 of the sub-pixel 101 and scattered to the surroundings to the front surface of the display panel 1100 to exit, thereby improving the light-exiting efficiency of the display panel 1100.

Referring to FIGS. 2 and 3A, the second lens pattern sub-region 221 is provided with a plurality of second protruding strips 2211 extending in the second direction M2, and the plurality of second protruding strips 2211 are distributed at intervals in the first direction M1. A second groove 2212 extending in the second direction M2 is provided between two adjacent protruding strips 2211.

The cooperation of the second lens pattern sub-region 221 and the dimming layer 300 can reflect part of the light, exiting from the light-emitting region 1011 of the sub-pixel 101 and scattered in the first direction M1 toward a direction away from the second lens pattern sub-region 221, to the front surface of the display panel 1100 to exit, thereby improving the light-exiting efficiency of the display panel 1100.

Referring to FIG. 2, in the display panel 1100 provided in the embodiment of the present disclosure, two film layers (the first lens sub-layer 210 and the second lens sub-layer 220) are used to respectively form the plurality of first protruding strips 2111 and the plurality of second protruding strips 2211 that extend in two directions, and the plurality of first protruding strips 2111 and the plurality of second protruding strips 2211 are combined to be a grid. In this way, the requirement for patterning precision of each film layer is relatively low, which is beneficial to reducing the difficulty of the process for manufacturing the lens layer 200.

Due to a low process precision requirement for manufacturing the lens layer 200, the lens layer 200 may be made of an organic material, that is, the lens layer 200 may be an organic film layer. Compared with patterning an inorganic film layer, patterning the organic film layer is simpler, which is beneficial to reducing the difficulty of the process for manufacturing the lens layer 200. For example, patterning the organic film layer may be achieved by exposure and development, while patterning the inorganic film layer needs to be achieved by coating photoresist, exposing, developing, etching and removing photoresist.

The second groove 2212 and the first groove 2112 cooperate with the dimming layer 300 to reflect at least part of the light exiting from the light-emitting region 1011 of the sub-pixel 101 and scattered to the surroundings to the front surface of the display panel 1100 to exit, thereby improving the light-exiting efficiency of the display panel 1100.

In some embodiments, referring to FIG. 3B, the second lens sub-layer 220 further has a second connection pattern region 222. The second connection pattern region 222 has a plurality of second opening regions 2222, and each second opening region 2222 surrounds a second lens pattern sub-region 221. The plurality of second protruding strips 2211 provided in the second lens pattern sub-region 221 are located in the second opening region 2222 formed by the second connection pattern region 222. For example, a border of the second opening region 2222 coincides with the border of the second lens pattern sub-region 221, and the second lens pattern sub-regions 221 are connected through the second connection pattern region 222.

The second connection pattern region 222 is provided with a second connection pattern 2221, and a surface of the second connection pattern 2221 away from the display substrate 100 is substantially flat. In this way, it is beneficial to provide other structures (e.g., the touch electrode layer 400 or the bridging layer 500) on the surface of the second connection pattern 2221 away from the display substrate 100. Moreover, there is no need to pattern the surface of the second connection pattern 2221 away from the display substrate 100, which can reduce the difficulty of manufacturing the second lens sub-layer 220. The second connection pattern 2221 provided in the second connection pattern region 222 and the plurality of second protruding strips 2211 provided in the second lens pattern sub-region 221 are made of the same material and disposed in the same layer, which is beneficial to simplifying the manufacturing process of the second lens sub-layer 220 and reducing the manufacturing cost of the display panel 1100.

In some embodiments, referring to FIG. 3A, in a cross-sectional profile of the second protruding strip 2211 parallel to the first direction M1 and perpendicular to the display substrate 100, an end of the second protruding strip 2211 away from the display substrate 100 is approximately arc-shaped; and/or referring to FIG. 5A, in a cross-sectional profile of the first protruding strip 2111 parallel to the second direction M2 and perpendicular to the display substrate 100, an end of the first protruding strip 2111 away from the display substrate 100 is approximately arc-shaped.

The arc-shaped structure of the first protruding strip 2111 and/or the arc-shaped structure of the second protruding strip 2211 can increase an incident angle of the light exiting from the light-emitting region 1011 and scattered to the surroundings when the light exits from a portion of the dimming layer 300 in the notches 2011 to the first protruding strip 2111 and/or the second protruding strip 2211, thereby increasing the probability that the above light is reflected at an interface between the dimming layer 300 and the first protruding strips 2111 and/or between the dimming layer 300 and the second protruding strips 2211. As a result, the reflection amount of the above light may increase, and the light-exiting efficiency of the front surface of the display panel 1100 may increase.

In some embodiments, in a case where the lens layer 200 includes the first lens sub-layer 210 and the second lens sub-layer 220, borders of orthogonal projections of the first lens pattern sub-region 211 and the second lens pattern sub-region 221 on the display substrate 100, which are opposite to the light-emitting region 1011 of the same sub-pixel 101, substantially coincide, so that the light exiting from the sub-pixel 101 may simultaneously enter the first lens pattern sub-region 211 and the second lens pattern sub-region 221.

The display panel 1100 may further include other functional layer integration (FLI). For example, the functional layer integration may be a touch structure layer, a color filter structure layer, or the like.

The touch structure layer is disposed on the side of the light-exiting surface of the display substrate 100, so that the display panel 1100 may have a touch function. The touch structure layer may be an external structure or directly disposed on the encapsulation layer 130 of the display substrate 100. Compared with the external structure, the touch structure layer being directly disposed on the encapsulation layer 130 of the display substrate 100 may reduce a thickness of the display panel 1100 and make the display apparatus 1000 lighter and thinner. The touch structure layer includes the touch electrode layer and the bridging layer, and the touch electrode layer and the bridging layer may be a metal mesh made of metal materials. Alternatively, the touch electrode layer and the bridging layer may be block structures made of transparent conductive materials such as indium tin oxide (ITO).

The color filter structure layer is disposed on the side of the light-exiting surface of the display substrate 100, which may reduce the reflection of external light by the light-exiting surface of the display panel 1100.

Figures 5B, 6:
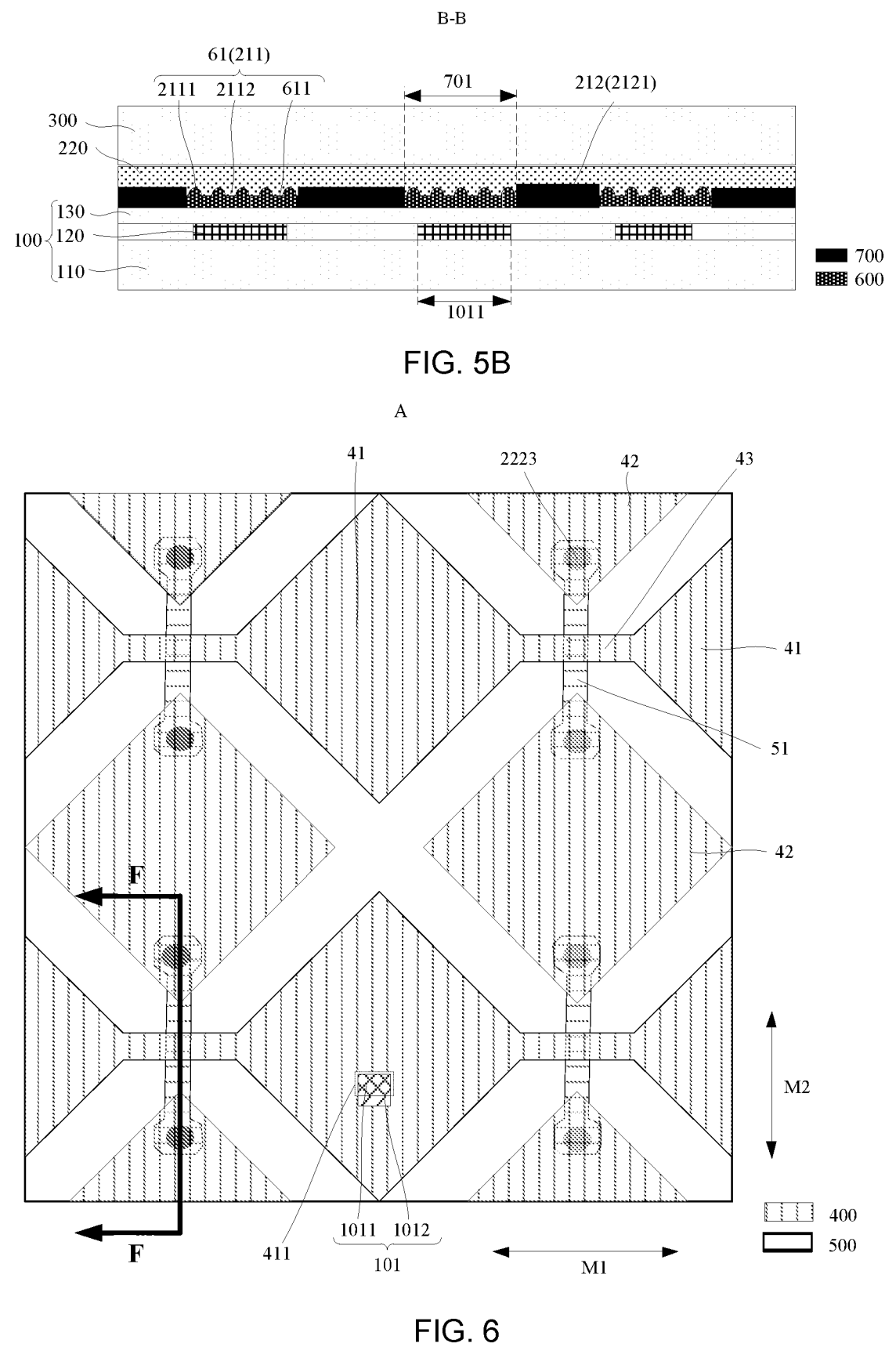

In some embodiments, referring to FIGS. 6 and 7, in a case where the display panel 1100 further includes the touch structure layer, the display panel 1100 includes the touch electrode layer 400 and the bridging layer 500. The touch electrode layer 400 and the bridging layer 500 are both made of conductive materials. Based on this, at least one insulating layer is provided between the touch electrode layer 400 and the bridging layer 500, so as to avoid direct contact between the touch electrode layer 400 and the bridging layer 500.

The touch electrode layer 400 is disposed on the side of the light-exiting surface of the display substrate 100, and includes a plurality of first electrodes 41 arranged in the first direction M1, a plurality of second electrodes 42 arranged in the second direction M2, and a plurality of connecting portions 43. The bridging layer 500 is disposed on a side of the touch electrode layer 400 proximate to or away from the display substrate 100, and includes a plurality of bridging portion 51. FIG. 6 exemplarily shows a structure in which the bridging layer 500 is disposed on the side of the touch electrode layer 400 proximate to the display substrate 100.

Two adjacent first electrodes 41 in the first direction M1 are electrically connected through a connecting portion 43, and two adjacent second electrodes 42 in the second direction M2 are electrically connected through a bridging portion 51. Alternatively, two adjacent first electrodes 41 in the first direction M1 are electrically connected through a bridging portion 51, and two adjacent second electrodes 42 in the second direction M2 are electrically connected through a connecting portion 43.

FIG. 6 only exemplarily shows a structure in which two adjacent first electrodes 41 in the first direction M1 are electrically connected through the connecting portion 43, and two adjacent second electrodes 42 in the second direction M2 are electrically connected through the bridging portion 51.

At least one of the lens layer 200 and the dimming layer 300 is disposed between the touch electrode layer 400 and the bridging layer 500, so that the lens layer 200 and/or the dimming layer 300 between the touch electrode layer 400 and the bridging layer 500 further serve as the at least one insulating layer between the touch electrode layer 400 and the bridging layer 500. As a result, the number of layers of the display panel 1100 may be reduced, which is beneficial to achieving the lightness and thinness of the display panel 1100, and reducing the manufacturing cost of the display panel.

In some embodiments, in a case where the lens layer 200 includes the first lens sub-layer 210 and the second lens sub-layer 220, one of the touch electrode layer 400 and the bridging layer 500 is disposed between the first lens sub-layer 210 and the second lens sub-layer 220, the other of the touch electrode layer 400 and the bridging layer 500 is disposed between the second lens sub-layer 220 and the dimming layer 300. That is, the first lens sub-layer 210 is disposed on a side of the touch electrode layer 400 and the bridging layer 500 proximate to the display substrate 100, the second lens sub-layer 220 is disposed between the touch electrode layer 400 and the bridging layer 500, and the dimming layer 300 is disposed on a side of the touch electrode layer 400 and the bridging layer 500 away from the display substrate 100.

The second lens sub-layer 220 is located between the touch electrode layer 400 and the bridging layer 500, and may be used as an insulating layer between the touch electrode layer 400 and the bridging layer 500, thereby reducing the number of layers of the display panel 1100, simplifying the manufacturing process of the display panel 1100 and reducing the manufacturing cost of the display panel 1100. For example, referring to FIG. 7, the bridging layer 500 is disposed between the first lens sub-layer 210 and the second lens sub-layer 220, and the touch electrode layer 400 is disposed between the second lens sub-layer 220 and the dimming layer 300.

In some embodiments, in order to reduce the influence of both the touch electrode layer 400 and the bridging layer 500 on the light-exiting rate of the display panel 1100, orthogonal projections of the first electrode 41, the second electrode 42, the connecting portion 43 and the bridging portion 51 on the display substrate 100 are all separated from the light-emitting region 1011 of the sub-pixel 101.

For example, the first lens sub-layer 210 includes the first connection pattern region 212, and the second lens sub-layer 220 includes the second connection pattern region 222. The bridging portion 51 is disposed on the first connection pattern 2121 provided in the first connection pattern region 212. The first electrode 41, the second electrode 42 and the connecting portion 43 are disposed on the second connection pattern 2221 provided in the second connection pattern region 222. Referring to FIG. 6, the sub-pixel 101 includes the light-emitting region 1011 and a circuit region 1012. The first electrode 41 and/or the second electrode 42 are each provided with hollowed-out regions 411 therein at positions opposite to the light-emitting region 1011 of the sub-pixel 101 (FIG. 6 only exemplarily shows that a hollowed-out region 411 is provided in a first electrode 41), so that the light-emitting region 1011 of the sub-pixel 101 is separated from projections of the first electrode 41 and the second electrode 42 on the display substrate 100 (there is no overlapping region).

The light-emitting region 1011 and the circuit region 1012 have a relative positional relationship, shapes and an area ratio not necessarily as shown in FIG. 6. The light-emitting region 1011 and the circuit region 1012 shown in FIG. 6 are only schematic, and there may be an overlapping portion therebetween, and the shapes of the light-emitting region 1011 and the circuit region 1012 are not limited to rectangles. Moreover, a ratio relationship between an area of the sub-pixel 101 and an area of the first electrode 41 is not necessarily as shown in FIG. 6.

Referring to FIG. 7, the second lens sub-layer 220 includes the second connection pattern 2221, and the second connection pattern 2221 is provided therein with via holes 2223 each for connecting the bridging layer 500 and the touch electrode layer 400.

In a case where the two adjacent second electrodes 42 in the second direction M2 are electrically connected through the bridging portion 51, the two adjacent second electrodes 42 in the second direction M2 are each electrically connected to the same bridging portion 51 through at least one via hole 2223. In a case where the two adjacent first electrodes 41 in the first direction M1 are electrically connected through the bridging portion 51, the two adjacent first electrodes 41 in the first direction M1 are each electrically connected to the same bridging portion 51 through at least one via hole 2223.

In some embodiments, referring to FIG. 5B, in a case where the display panel 1100 further includes the color filter structure layer (i.e., in a case where the display panel 1100 has a structure of a color filter layer on the encapsulation layer 130 (CF on Encapsulation, COE for short)), the display panel 1100 further includes the color filter layer 600 and a black matrix 700.

The color filter layer 600 is disposed on the side of the light-exiting surface of the display substrate 100, and includes a plurality of filter portion 61. Each filter portion 61 is opposite to the light-emitting region 1011 of the sub-pixel 101, so that the light exiting from the light-emitting region 1011 of each sub-pixel 101 may pass through the filter portion 61. The filter portion 61 only allows light within a target wavelength range to pass through, so that the light passing through the filter portion 61 has a target color. For example, the filter portions 61 may include a red filter portion, a blue filter portion and a green filter portion.

The black matrix 700 includes a plurality of openings 701, and at least a portion of each filter portion 61 is located in an opening 701. The black matrix 700 may reduce the reflection of ambient light on the light-exiting surface of the display panel 1100 and improve the contrast of images displayed on the display panel 1100.

Referring to FIG. 5B, the filter portion 61 includes a base layer 611 and a plurality of first protruding strips 2111 disposed on a surface of the base layer 611 away from the display substrate 100, and the plurality of first protruding strips 2111 are used to form the plurality of first grooves 2112 in the first lens pattern sub-region 211. That is, an end of the first groove 2112 proximate to the display substrate 100 does not penetrate through the filter portion 61, so that all the light exiting from the sub-pixel 101 can pass through the filter portion 61. The base layer 611 and the plurality of first protruding strips 2111 may be of a one-piece structure.

In some embodiments, in a case where the first lens sub-layer 210 includes the first connection pattern region 212, the black matrix 700 forms the first connection pattern 2121 provided in the first connection pattern region 212. In the display panel 1100 provided by the embodiment of the present disclosure, the plurality of first protruding strips 2111 provided in the first lens pattern sub-region 211 are formed by using the filter portion 61 of the color filter layer 600, the first connection pattern 2121 provided in the first connection pattern region 212 is formed by using the black matrix 700. Therefore, the first lens sub-layer 210 is formed by using the color filter structure layer (including the color filter layer 600 and the black matrix 700), which may reduce the number of layers of the display panel 1100, simplify the manufacturing process of the display panel 1100, and reduce the manufacturing cost of the display panel 1100.

In some embodiments, the display panel 1100 includes the first lens sub-layer 210 and the second lens sub-layer 220, and both the first lens sub-layer 210 and the second lens sub-layer 220 are organic film layers. For example, the materials of the first lens sub-layer 210 and the second lens sub-layer 220 may each be transparent optical clear adhesive (OCA) or transparent resin. Compared with the inorganic film layer, the patterning process of the organic film layer is simpler, and the patterning process may be directly performed through exposure and development, which is beneficial to reducing the difficulty of manufacturing the first lens sub-layer 210 and the second lens sub-layer 220.

The display substrate 100 includes at least one organic film layer on the side of the light-exiting surface of the display substrate 100, and the first lens sub-layer 210 and/or the second lens sub-layer 220 may be formed by using an existing organic film layer in the display panel 1100. As a result, the number of layers of the display panel 1100 may be reduced, the display panel 1100 may be thinner and lighter, and the manufacturing cost of the display panel 1100 may be reduced. For example, in the case where the display panel 1100 includes the touch structure layer, the display panel 1100 includes at least one transparent optical clear adhesive layer (at least one organic film layer), and the first lens sub-layer 210 and/or the second lens sub-layer 220 may be formed by using the at least one transparent optical clear adhesive layer.

In some embodiments, the dimming layer 300 is an organic film layer. For example, the material of the dimming layer 300 may be transparent optical clear adhesive or transparent resin. An effect that can be achieved when the light adjusting layer 300 is the organic film layer is similar to an effect that can be achieved when the first lens sub-layer 210 and the second lens sub-layer 220 are both organic film layers, and details will not be repeated here.

In some embodiments, in a case where the display panel 1100 includes the first lens sub-layer 210 and the second lens sub-layer 220, the first lens sub-layer 210 and the second lens sub-layer 220 have substantially the same refractive indexes for light. The first lens sub-layer 210 is used to form the first grooves 2111, and the second lens sub-layer 220 is used to form the second grooves 2212. Since light does not need to be reflected or refracted at an interface between the first lens sub-layer 210 and the second lens sub-layer 220, the refractive indexes of the first lens sub-layer 210 and the second lens sub-layer 220 for light are substantially the same. For example, the first lens sub-layer 210 and the second lens sub-layer 220 may be made of the same material, and in this case, the first lens sub-layer 210 and the second lens sub-layer 220 have the same refractive index.

In some embodiments, in the case where the display panel 1100 includes the first lens sub-layer 210 and the second lens sub-layer 220, the refractive indexes of the first lens sub-layer 210 and the second lens sub-layer 220 are each in a range of 1.4 to 1.5, inclusive. For example, the refractive indexes of the first lens sub-layer 210 and the second lens sub-layer 220 may each be 1.4, 1.45, 1.47, or 1.5, which will not be listed one by one here.

In some embodiments, the refractive index of the dimming layer 300 is in a range of 1.6 to 1.8, inclusive. For example, the refractive index of the dimming layer 300 may be 1.6, 1.7, 1.75, or 1.8, which will not be listed one by one here.

In some embodiments, a surface of the dimming layer 300 away from the display substrate 100 is substantially flat. The manufacturing process of the dimming layer 300 is simple, which is beneficial to reducing the manufacturing cost of the display panel 1100. For example, the dimming layer 300 may be manufactured through a coating process.

In some embodiments, the lens layer 200 may be a single-layer film structure. In this case, the plurality of notches 2011 are arranged in an array in the lens pattern region 201.

In some embodiments, a profile shape of an orthogonal projection of the notch 2011 on the display substrate 100 may be a rectangle, a circle, or an ellipse.

Figure 9:
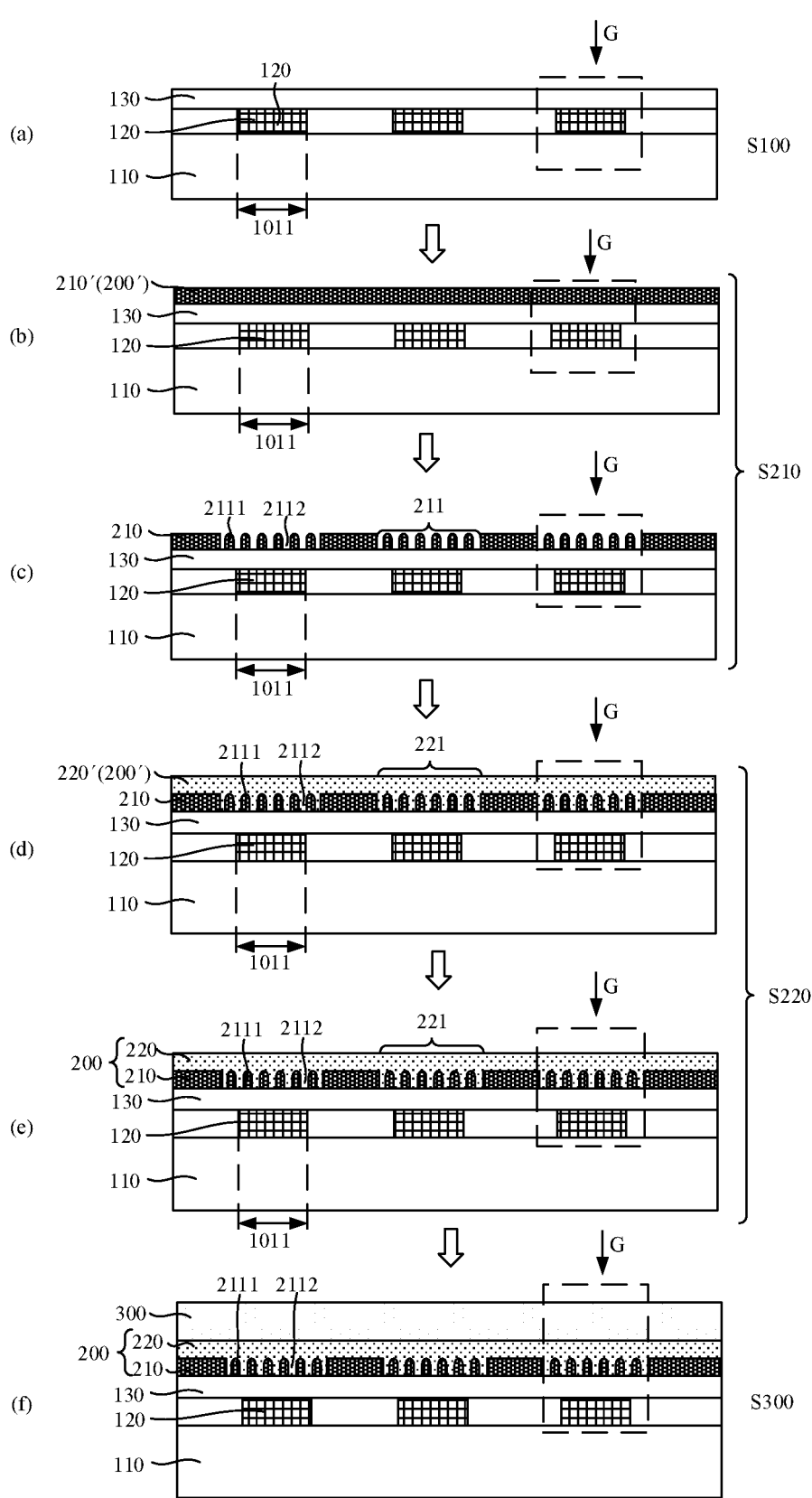
FIG. 9 is a process diagram of manufacturing a display panel, in accordance with some embodiments.
Figure 10:
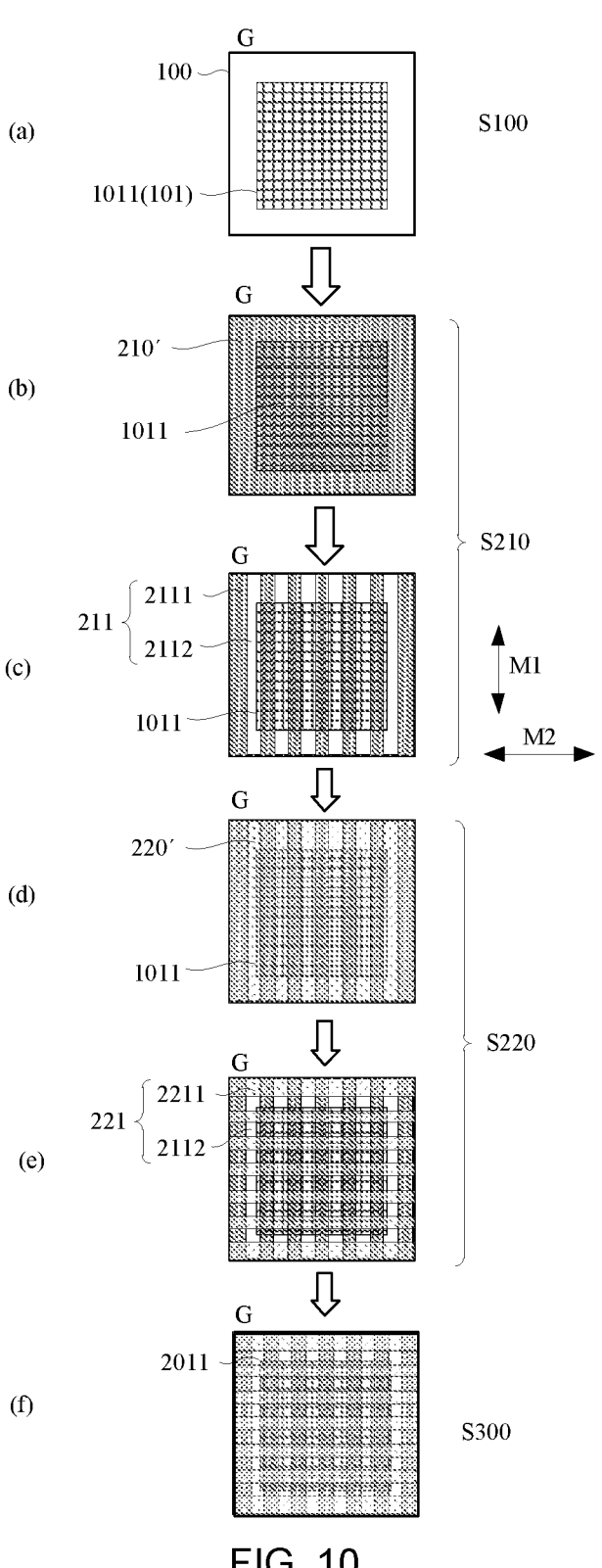
FIG. 10 is a view in a G direction during a process of manufacturing the display panel in FIG. 9.

Some embodiments of the present disclosure further provide a method of manufacturing a display panel 1100. Referring to FIGS. 8, 9 and 10, the method includes S100 to S300.

In S100, a display substrate 100 is manufactured.

The display substrate 100 includes a plurality of sub-pixels 101 arranged in an array, and each sub-pixel has a light-emitting region 1011.

In S200, a lens film 200' is formed on a light-exiting surface of the display substrate 100, and a plurality of target regions of the lens film 200' are patterned to form a plurality of notches 2011 in each target region, so as to obtain a lens layer 200.

Each lens pattern region 201 is opposite to a light-emitting region of a sub-pixel 101, and the light-emitting region 1011 of the sub-pixel 101 at least partially overlaps with an orthogonal projection of the lens pattern region 201 opposite thereto on the display substrate 100.

For example, the lens film 200' may be formed through a coating process, and a plurality of lens pattern regions 201 of the lens film 200' are patterned through exposure, development and etching, so that the plurality of notches 2011 are formed in the lens pattern region 201 of the lens film 200', and then the lens film 200' is made into the lens layer 200.

It will be understood that the lens film 200' is a whole-layer film structure, and the lens layer 200 is a film structure formed after patterning the lens film 200'. Each lens pattern region 201 is provided with the plurality of notches 2011 therein.

In some embodiments, forming the lens film 200' on the light-exiting surface of the display substrate 100, and patterning the plurality of target regions of the lens film 200' to form the plurality of notches 2011 in each target region, so as to obtain the lens layer 200 in S200, includes S210 to 220.

In S210, a first lens sub-film 210' is formed on the light-exiting surface of the display substrate 100, and a plurality of first target sub-regions of the first lens sub-film 210' are patterned to form a plurality of first protruding strips 2111 extending in a first direction M1 in each first target sub-region. The plurality of first protruding strips 2111 are distributed at intervals in a second direction M2, and a first groove 2112 is formed between two adjacent first protruding strips 2111, thereby obtaining a first lens sub-layer 210.

The first target sub-region of the first lens sub-film 210' serves as a first lens pattern sub-region 211 of the first lens sub-layer 210. Each first lens pattern sub-region 211 is opposite to the light-emitting region 1011 of the sub-pixel 101, and the light-emitting region 1011 of the sub-pixel 101 at least partially overlaps with an orthogonal projection of the first lens pattern sub-region 211 opposite thereto on the display substrate 100.

For example, the first lens sub-film 210' may be formed through a coating process, and the first lens sub-film 210' is patterned through processes such as exposure, development and etching, so as to form a plurality of first grooves 2112 in the first target sub-region of the first lens sub-film 210', and then the first lens sub-film 210' is made into the first lens sub-layer 210. A portion retained between two adjacent first grooves 2112 forms a first protruding strip 2111.

It will be understood that the first lens sub-film 210' is a whole-layer film structure formed by coating, and the first lens sub-layer 210 is a film structure formed after patterning the first lens sub-film 210'. The first direction M1 and the second direction M2 intersect with each other.

In S220, a second lens sub-film 220' is formed on a side of the first lens sub-layer 210 away from the display substrate 100, and a plurality of second target sub-regions of the second lens sub-film 220' are patterned to form a plurality of second protruding strips 2211 extending in the second direction M2. The plurality of second protruding strips 2211 are distributed at intervals in the first direction, and a second groove 2212 is formed between two adjacent second protruding strips 2211, thereby obtaining a second lens sub-layer 220.

The second target sub-region of the second lens sub-film 220' serves as a second lens pattern sub-region 221 of the second lens sub-layer 220. Each second lens pattern sub-region 221 is opposite to the light-emitting region 1011 of the sub-pixel 101, and the light-emitting region 1011 of the sub-pixel 101 at least partially overlaps with an orthogonal projection of the second lens pattern sub-region 221 opposite thereto on the display substrate 100.

For example, the second lens sub-film 220' may be formed through a coating process, and the second target sub-region of the second lens sub-film 220' is patterned through processes such as exposure, development and etching, so as to form a plurality of second grooves 2212 in the second lens pattern sub-region 221 of the second lens sub-layer 220. A portion retained between two adjacent second grooves 2212 forms a second protruding strip 2211.

In S300, a dimming layer 300 is formed on a side of the lens layer 200 away from the display substrate 100, so that at least a portion of the dimming layer 300 is filled in the plurality of notches 2011 of the lens pattern region 201.

A refractive index of the dimming layer 300 is greater than a refractive index of the lens layer 200. The plurality of notches 2011 include the first grooves 2112 and the second grooves 2212.

For example, the dimming layer 300 may be formed through a coating process. Alternatively, in a case where a material of the dimming layer 300 is suitable for inkjet printing equipment, the dimming layer 300 may be formed by inkjet printing.

The display panel 1100 obtained by the method provided by the embodiments of the present disclosure has the same beneficial effects as the display panel 1100 described in any of the above embodiments, and details will not repeated herein.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
   a display substrate including a plurality of sub-pixels arranged in an array, each sub-pixel having a light-emitting region;
   a lens layer disposed on a side of a light-exiting surface of the display substrate; the lens layer having a plurality of lens pattern regions, each lens pattern region being opposite to a light-emitting region of a sub-pixel, the light-emitting region of the sub-pixel at least partially overlapping with an orthogonal projection of the lens pattern region opposite thereto on the display substrate; and each lens pattern region being provided with a plurality of notches therein;
   a dimming layer disposed on a side of the lens layer away from the display substrate; at least a portion of the dimming layer being filled in the plurality of notches provided in the lens pattern region; and a refractive index of the dimming layer being greater than a refractive index of the lens layer;
   a touch electrode layer disposed on the side of the light-exiting surface of the display substrate, and including a plurality of first electrodes arranged in a first direction, a plurality of second electrodes arranged in a second direction, and a plurality of connecting portions; and
   a bridging layer disposed on a side of the touch electrode layer proximate to or away from the display substrate, and including a plurality of bridging portions, wherein two adjacent first electrodes in the first direction are electrically connected through a connecting portion, and two adjacent second electrodes in the second direction are electrically connected through a bridging portion; or the two adjacent first electrodes in the first direction are electrically connected through another bridging portion, and the two adjacent second electrodes in the second direction are electrically connected through another connecting portion, wherein
   at least one of the lens layer or the dimming layer is disposed between the touch electrode layer and the bridging layer.

2. The display panel according to claim 1, wherein the lens layer includes:
   a first lens sub-layer having a plurality of first lens pattern sub-regions; each first lens pattern sub-region being opposite to the light-emitting region of the sub-pixel, and the light-emitting region of the sub-pixel at least partially overlapping with an orthogonal projection of the first lens pattern sub-region opposite thereto on the display substrate, wherein each first lens pattern sub-region is provided therein with a plurality of first protruding strips extending in a first direction and distributed at intervals in a second direction; and two adjacent first protruding strips are provided with a first groove therebetween extending in the first direction; the plurality of notches include first grooves; the first direction intersects the second direction.

3. The display panel according to claim 2, wherein the first lens sub-layer further has a first connection pattern region; the first connection pattern region includes a plurality of first opening regions, and a border of each first opening region surrounds a first lens pattern sub-region; the first connection pattern region is provided with a first connection pattern therein, and a surface of the first connection pattern away from the display substrate is substantially flat.

4. The display panel according to claim 2, wherein the lens layer further includes:
   a second lens sub-layer disposed between the first lens sub-layer and the dimming layer; the second lens sub-layer having a plurality of second lens pattern sub-regions; each second lens pattern sub-region being opposite to the light-emitting region of the sub-pixel, and the light-emitting region of the sub-pixel at least partially overlapping with an orthogonal projection of the second lens pattern sub-region opposite thereto on the display substrate, wherein each second lens pattern sub-region is provided therein with a plurality of second protruding strips extending in the second direction and distributed at intervals in the first direction; and two adjacent second protruding strips are provided with a second groove therebetween extending in the second direction; the plurality of notches further include second grooves.

5. The display panel according to claim 4, wherein the second lens sub-layer further has a second connection pattern region, the second connection pattern region includes a plurality of second opening regions, and a border of each second opening region surrounds a second lens pattern sub-region; the second connection pattern region is provided with a second connection pattern therein, and a surface of the second connection pattern away from the display substrate is substantially flat; and the second connection pattern and the plurality of second protruding strips provided in the second lens pattern sub-region are made of a same material and disposed in a same layer.

6. The display panel according to claim 4, wherein
   in a cross-sectional profile of a first protruding strip parallel to the second direction and perpendicular to the display substrate, an end of the first protruding strip away from the display substrate is approximately arc-shaped; and/or in a cross-sectional profile of a second protruding strip parallel to the first direction and perpendicular to the display substrate, an end of the second protruding strip away from the display substrate is approximately arc-shaped.

7. The display panel according to claim 4, wherein borders of orthogonal projections of the first lens pattern sub-region and the second lens pattern sub-region, that are opposite to the light-emitting region of the same sub-pixel, on the display substrate substantially coincide.

8. The display panel according to claim 1, wherein the lens layer includes a first lens sub-layer and a second lens sub-layer;

one of the touch electrode layer and the bridging layer is disposed between the first lens sub-layer and the second lens sub-layer; and another of the touch electrode layer and the bridging layer is disposed between the second lens sub-layer and the dimming layer.

9. The display panel according to claim 8, wherein the second lens sub-layer includes a second connection pattern, and the second connection pattern is provided therein with via holes each for connecting the bridging layer and the touch electrode layer.

10. The display panel according to claim 1, wherein the lens layer includes:

a color filter layer disposed on the side of the light-exiting surface of the display substrate and including a plurality of filter portions, each filter portion being opposite to the light-emitting region of the sub-pixel; and a black matrix including a plurality of openings, at least a portion of each filter portion being located in an opening, wherein the filter portion includes a base layer and a plurality of first protruding strips disposed on a surface of the base layer away from the display substrate; the base layer and the plurality of first protruding strips are of a one-piece structure, and two adjacent first protruding strips are provided with a first groove therebetween.

11. The display panel according to claim 1, wherein the lens layer includes a first lens sub-layer and a second lens sub-layer, and the first lens sub-layer and the second lens sub-layer are both organic film layers.

12. The display panel according to claim 1, wherein the lens layer includes a first lens sub-layer and a second lens sub-layer, and the first lens sub-layer and the second lens sub-layer have substantially same refractive indexes for light.

13. The display panel according to claim 1, wherein the lens layer includes a first lens sub-layer and a second lens sub-layer, and the first lens sub-layer and the second lens sub-layer each have a refractive index of 1.4 to 1.5, inclusive.

14. The display panel according to claim 1, wherein the light-emitting region of the sub-pixel is located within a border of the orthogonal projection of the lens pattern region opposite thereto on the display substrate, and a gap between a border of the light-emitting region of the sub-pixel and the border of the orthogonal projection of the lens pattern region opposite thereto on the display substrate is in a range of 1 $\mu$m to 5 $\mu$m, inclusive.

15. The display panel according to claim 1, wherein the refractive index of the dimming layer is in a range of 1.6 to 1.8, inclusive.

16. The display panel according to claim 1, wherein a surface of the dimming layer away from the display substrate is substantially flat.

17. The display panel according to claim 1, wherein the dimming layer is an organic film layer.

18. A display apparatus, comprising the display panel according to claim 1.

19. A display panel, comprising:

a display substrate including a plurality of sub-pixels arranged in an array, each sub-pixel having a light-emitting region;

a lens layer disposed on a side of a light-exiting surface of the display substrate; the lens layer having a plurality of lens pattern regions, each lens pattern region being opposite to a light-emitting region of a sub-pixel, the light-emitting region of the sub-pixel at least partially overlapping with an orthogonal projection of the lens pattern region opposite thereto on the display substrate; and each lens pattern region being provided with a plurality of notches therein; and a dimming layer disposed on a side of the lens layer away from the display substrate; at least a portion of the dimming layer being filled in the plurality of notches provided in the lens pattern region; and a refractive index of the dimming layer being greater than a refractive index of the lens layer;

wherein the lens layer includes:

a color filter layer disposed on the side of the light-exiting surface of the display substrate and including a plurality of filter portions, each filter portion being opposite to the light-emitting region of the sub-pixel; and a black matrix including a plurality of openings, at least a portion of each filter portion being located in an opening, wherein the filter portion includes a base layer and a plurality of first protruding strips disposed on a surface of the base layer away from the display substrate; the base layer and the plurality of first protruding strips are of a one-piece structure, and two adjacent first protruding strips are provided with a first groove therebetween.

* * * * *